US005893749A

United States Patent [19]
Matumoto

[11] Patent Number: 5,893,749
[45] Date of Patent: Apr. 13, 1999

[54] METHOD FOR FORMING A HOLE FILLING PLUG FOR A SEMICONDUCTOR DEVICE

[75] Inventor: Akira Matumoto, Tokyo, Japan

[73] Assignee: NEC Corporation, Tokyo, Japan

[21] Appl. No.: 08/575,478

[22] Filed: Dec. 20, 1995

[30] Foreign Application Priority Data

Dec. 20, 1994 [JP] Japan .................. 6-316188

[51] Int. Cl.$^6$ .................. H01L 21/28; H01L 21/31
[52] U.S. Cl. .................. 438/627; 438/628; 438/637; 438/648
[58] Field of Search .................. 437/187, 189, 437/190, 192, 200; 438/627, 628, 629, 643, 644, 637, 648

[56] References Cited

U.S. PATENT DOCUMENTS

| | | | |
|---|---|---|---|
| 4,822,753 | 4/1989 | Pintchovski et al. | 437/192 |
| 4,960,732 | 10/1990 | Dixit et al. | 438/627 |
| 5,167,760 | 12/1992 | Mu et al. | 437/192 |
| 5,225,372 | 7/1993 | Savkar et al. | 437/190 |
| 5,306,952 | 4/1994 | Matsuura et al. | 257/165 |
| 5,374,591 | 12/1994 | Hasegawa et al. | 437/187 |

OTHER PUBLICATIONS

J. Van Laarhoven et al., "A Novel Blanket Tungsten Etchback Scheme", IEEE, Jun. 12–13, 1989, pp. 129–135, VMIC Conf.

*Primary Examiner*—T. N. Quach
*Attorney, Agent, or Firm*—Young & Thompson

[57] ABSTRACT

In a method for forming a tungsten plug interconnecting an upper level wiring conductor and a lower level wiring conductor insulated from each other by an interlayer insulator film, an adhesion layer is formed on the interlayer insulator film formed on the lower level wiring conductor. A photoresist layer is deposited on the adhesion layer, and an opening is formed in the photoresist layer. The adhesion layer is selectively removed by an isotropic etching using, as a mask, the photoresist layer having the opening formed therein, so that an opening retracted outwardly from the edge of the opening formed in the photoresist layer is formed in the adhesion layer. A hole is formed through the interlayer insulator film so that the lower level wiring conductor is exposed at a bottom of the hole, and a tungsten layer is formed in the hole of the interlayer insulator film so as to form a tungsten filling for the hole of the interlayer insulator film.

5 Claims, 6 Drawing Sheets

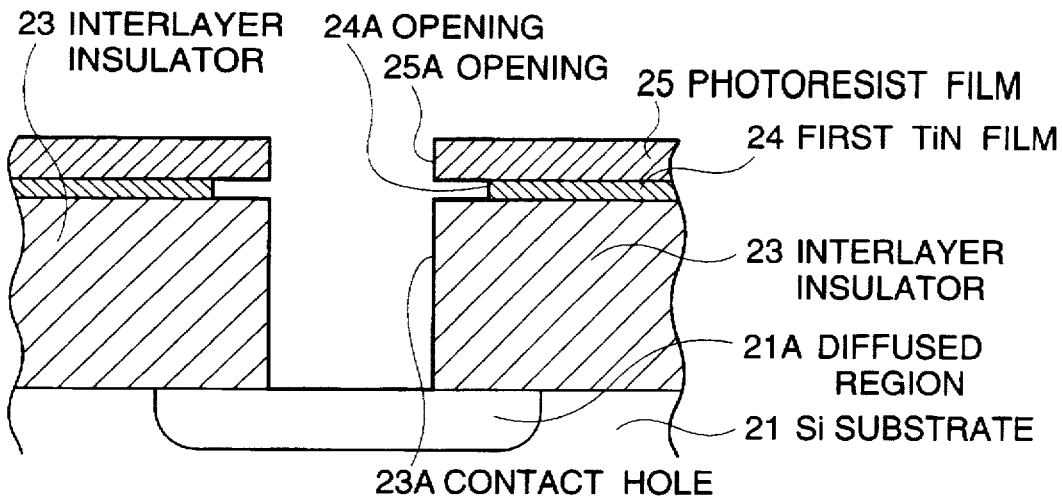
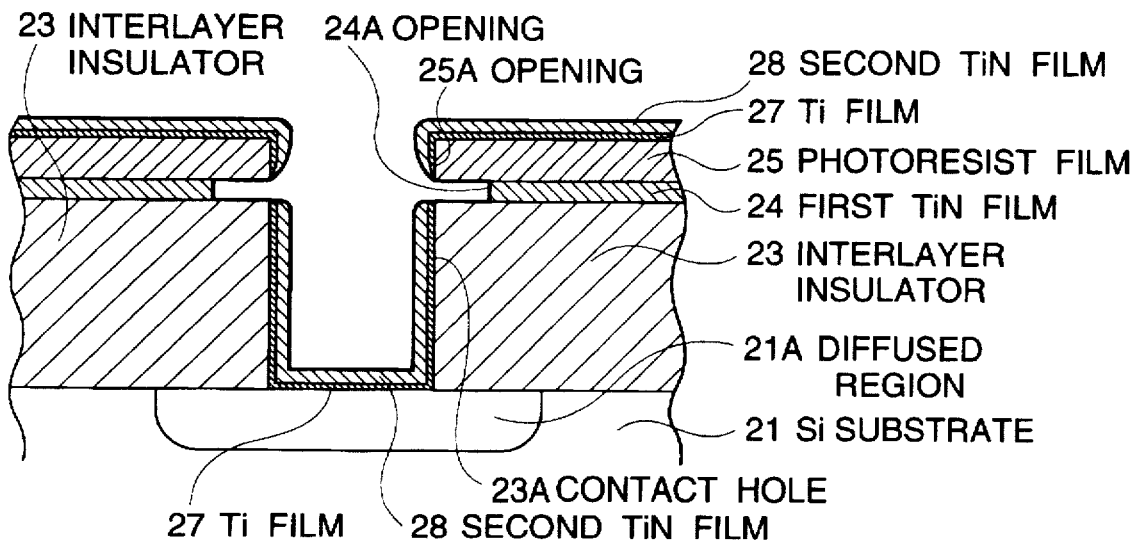
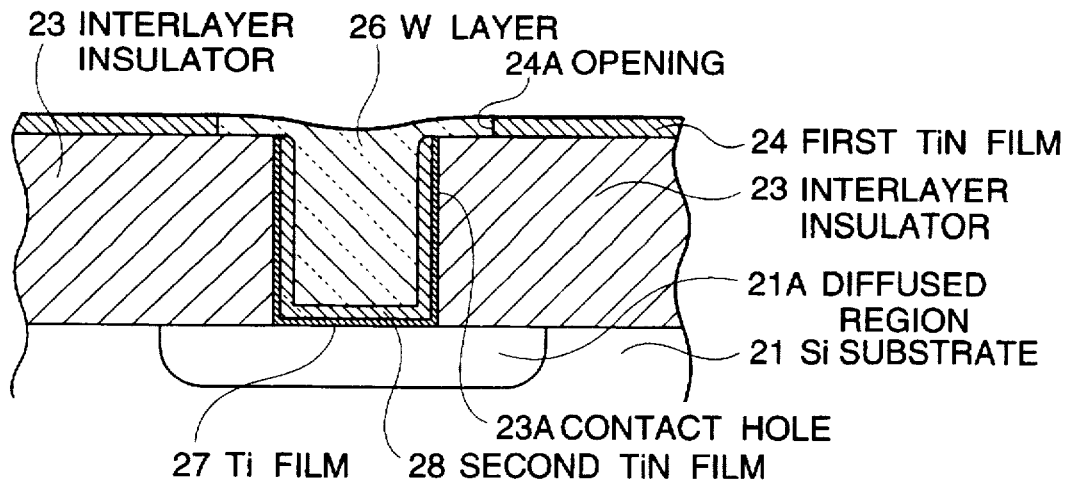

METHOD FOR FORMING A HOLE FILLING PLUG FOR A SEMICONDUCTOR DEVICE

BACKGROUND OF THE INVENTION

1. Field of the Invention

The present invention relates to a method for manufacturing a semiconductor device, and more specifically to a method for forming a hole filling plug.

2. Description of Related Art

As a technology for filling a fine contact hole or via-hole, a formation of a tungsten (W) plug by a blanket WCVD (tungsten chemical vapor deposition), has been reduced into practice, which is excellent in step coverage and low in resistance. This blanket WCVD method is a method of charging a W layer into a via-hole formed in an interlayer insulator film so as to form a plug.

Referring to FIGS. 1A to 1C, there are shown diagrammatic sectional views illustrating a process for forming a via-hole filling W plug in accordance with a conventional blanket WCVD process. As shown in FIG. 1A, an interlayer insulator film 33 is formed on a first TiN (titanium nitride) film 32 formed on a lower level wiring Al conductor 31, and a via-hole 33A is formed through the interlayer insulator film 33 by a conventional photolithography and an anisotropic dry etching, so that a portion of the first TiN film 32 is exposed at a bottom of the via-hole 33A.

Then, as shown in FIG. 1B, a second TiN film 34 is deposited by a sputtering so as to cover a whole surface including the bottom and a side wall of the via-hole 33A. Furthermore, a W (tungsten) layer 36 is deposited in the via-hole 33A and the surface of the interlayer insulator film 33, and succeedingly, the deposited W layer 36 is etched back so that the W layer 36 excluding the W layer filled in the via-hole 33A is removed. Thus, as shown in FIG. 1C, a W plug consisting of the W layer 36 is formed in the via-hole 33A. This W plug consisting of the W layer 36 is used to interconnect the lower level wiring Al conductor 31 and a not-shown upper level wiring Al conductor which are insulated from each other by the interlayer insulator film 33.

In the above mentioned conventional process, the second TiN film 24 is formed as an adhesion layer, ordinarily by sputtering. In this sputtering process, a growth speed of the TiN film 34 is higher at an opening edge of the via-hole than at the other regions. As a result, it has been confirmed by experiments that, as shown in FIGS. 1B and 1C, the TiN film 34 has an overhanging portion 34A around the opening edge of the via-hole 33A. If the W layer is deposited by the blanket WCVD process in a condition that the TiN film 34 has the overhanging portion 34A, the deposited W layer 36 reflects the shape of the overhanging portion 34A of the TiN film 34, with the result that a void 39 occurs in the W layer 36 charged in the via-hole 33A. The cause for this is considered that since the overhanging portion 34A of the TiN film 34 projects inwardly from around the opening edge of the via-hole 33A, the overhanging portion 34A of the TiN film 34 becomes a growth core when the W layer 36 is deposited, and therefore, the W layer 36 starts to grow from around the opening edge of the via-hole 33A, so that the opening of the via-hole 33A is closed before the whole of the via-hole is completely charged or filled with the W layer 36.

In order to prevent the overhanging of the sputter-deposited TiN film from the opening edge of the via-hole 33A, it is considered, as shown in FIG. 2, to form the second TiN film 34 on the interlayer insulator film 33 by sputtering, then to form a via-hole 33A through the second TiN film 34 and the interlayer insulator film 33 by a conventional photolithography and an anisotropic dry etching, and thereafter to perform the blanket WCVD process. In this process, however, since an inner edge 34B of the TiN film 34 is exposed around the opening edge of the via-hole 33A, the inner edge 34B of the TiN film 34 becomes a growth core when the W layer 36 is deposited. As a result, a void 39 occurs in the W layer 36 filled in the via-hole 33A, similarly to the example shown in FIG. 1C. This has been also confirmed by experiment.

If the void 39 occurs in the W layer 36 filled in the via-hole 33A as shown in FIGS. 1C and 2, wiring defects such as disconnects are apt to occur easily. In order to prevent this problem, it is necessary to prevent generation of the void. For preventing generation of the void, it it required to suppress the growth of the W layer around the opening edge of the via-hole 33A, so that the W layer is uniformly grown from the bottom of the via-hole to fill the whole of the via-hole.

SUMMARY OF THE INVENTION

Accordingly, it is an object of the present invention to provide a method for forming a hole filling plug, which has overcome the above mentioned defect of the conventional one.

Another object of the present invention is to provide a method for forming a hole filling plug, capable of preventing generation of void in the hole filling plug, so as to minimize generation of the connection defects.

The above and other objects of the present invention are achieved in accordance with the present invention by a method for manufacturing a semiconductor device, comprising the steps of forming a recess in an insulator film provided on a semiconductor substrate, forming an adhesion layer on at least a portion of a side surface and a bottom surface of the recess so that the insulator film is exposed in a predetermined region extending from an edge of the recess inclusive, and deposition a metal or a metal compound into an inside of the recess. For example, the deposition of the metal or the metal compound is performed by a chemical vapor deposition.

Preferably, according to the present invention, there is provided a method for forming a tungsten plug interconnecting an upper level conductor and a lower level conducting region insulated from each other by an interlayer insulator film, comprising the steps of:

forming the interlayer insulator film on the lower conducting region;

forming an adhesion layer on the interlayer insulator film;

forming a photoresist layer on the adhesion layer;

forming an opening in the photoresist layer so as to prepare a mask layer of the photoresist layer having the opening for a hole to be formed in the interlayer insulator film;

selectively removing the adhesion layer to form an opening corresponding to the opening formed in the photoresist layer and to further remove, from around an edge of the opening formed in the photoresist layer, the adhesion layer which would otherwise become a growth core when a tungsten is grown;

forming a hole through the interlayer insulator film so that the lower level conducting region is exposed at a bottom of the hole; and depositing a tungsten layer in the hole of the interlayer insulator film so as to form a tungsten filling the hole of the interlayer insulator film.

In one embodiment, the selective removal of the adhesion layer is carried out by an etching. More preferably, this etching is an isotropic etching using, as a mask, the photoresist layer having the opening formed therein, so that the opening formed in the adhesion layer is retracted outwardly from the edge of the opening formed in the photoresist layer.

In addition, the tungsten layer is directly deposited into the hole of the interlayer insulator film. Alternatively, before the tungsten layer is deposited into the hole of the interlayer insulator film, a second adhesion layer is formed on a side wall and a bottom of the hole of the interlayer insulator film, and thereafter, the tungsten layer is deposited into the hole of the interlayer insulator film. These adhesion layers are formed of for example a titanium nitride film.

As seen from the above, in the method in accordance with the present invention, the adhesion layer which would otherwise become a growth core when a tungsten is grown, is removed from the edge of the hole formed in the interlayer insulator layer. Therefore, the tungsten layer is uniformly depositing into the whole of the hole of the interlayer insulator layer.

The above and other objects, features and advantages of the present invention will be apparent from the following description of preferred embodiments of the invention with reference to the accompanying drawings.

BRIEF DESCRIPTION OF THE DRAWINGS

FIGS. 4A to 4C are diagrammatic sectional views illustrating a second embodiment of the process in accordance with the present invention for forming a contact hole filling W plug.

DESCRIPTION OF THE PREFERRED EMBODIMENTS

Figure 1A:
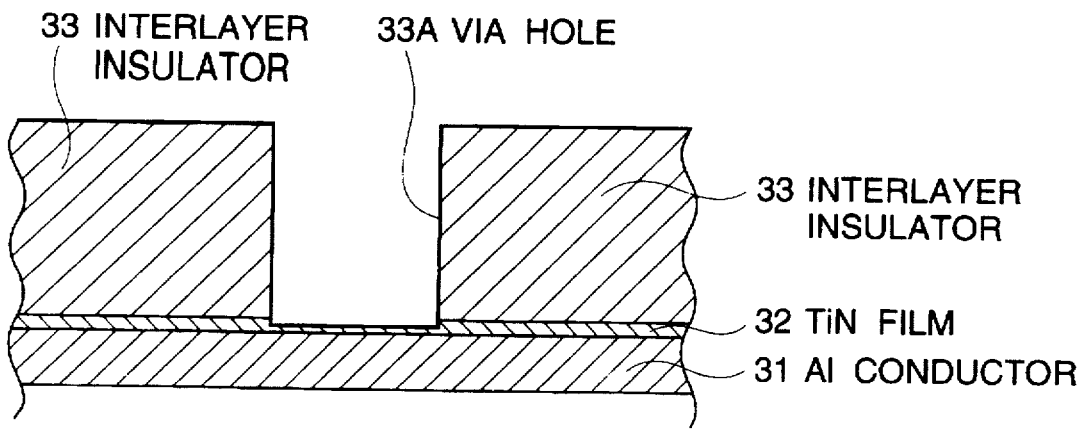
FIGS. 1A to 1C are diagrammatic sectional views illustrating a process for forming a via-hole filling W plug in accordance with a conventional blanket WCVD process.
Figure 1B:
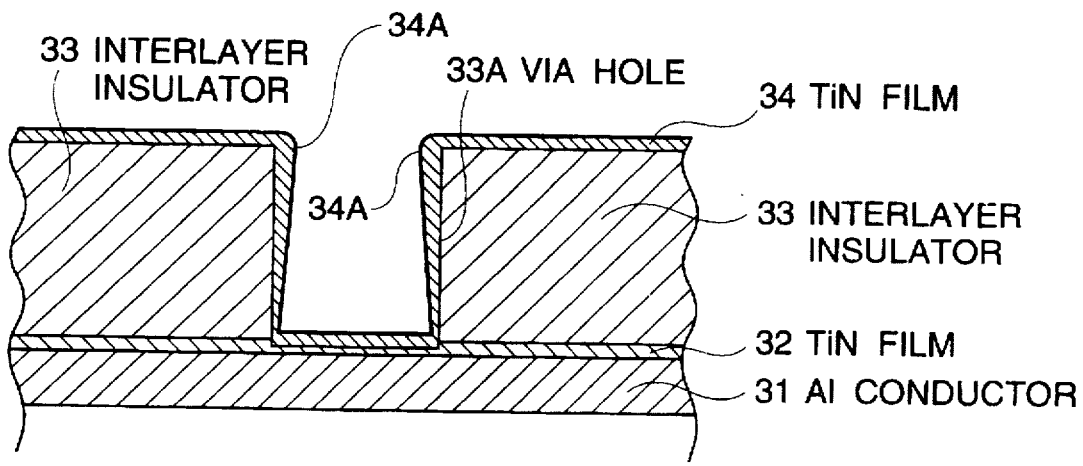
Figure 1C:
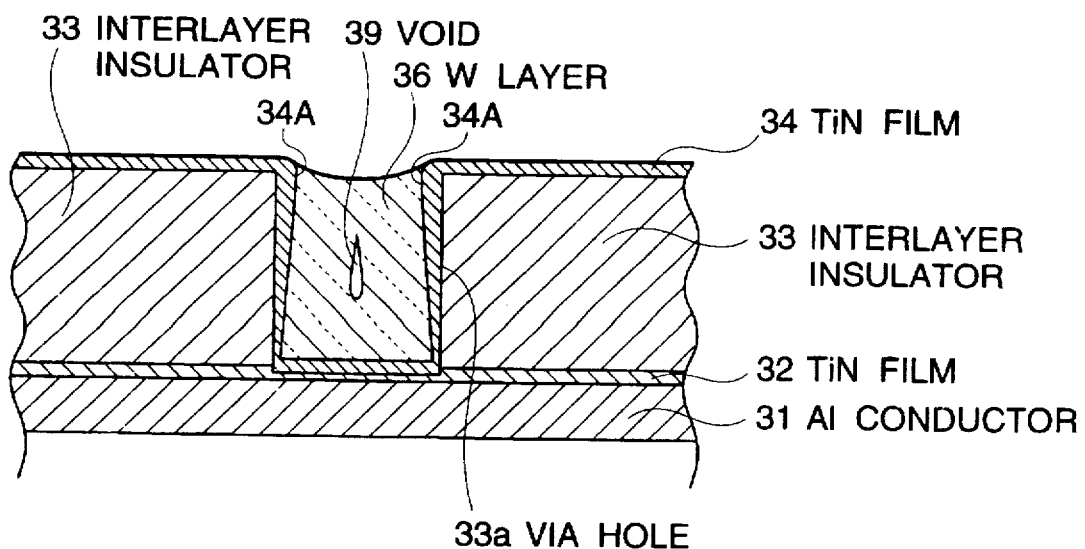
Figure 2:
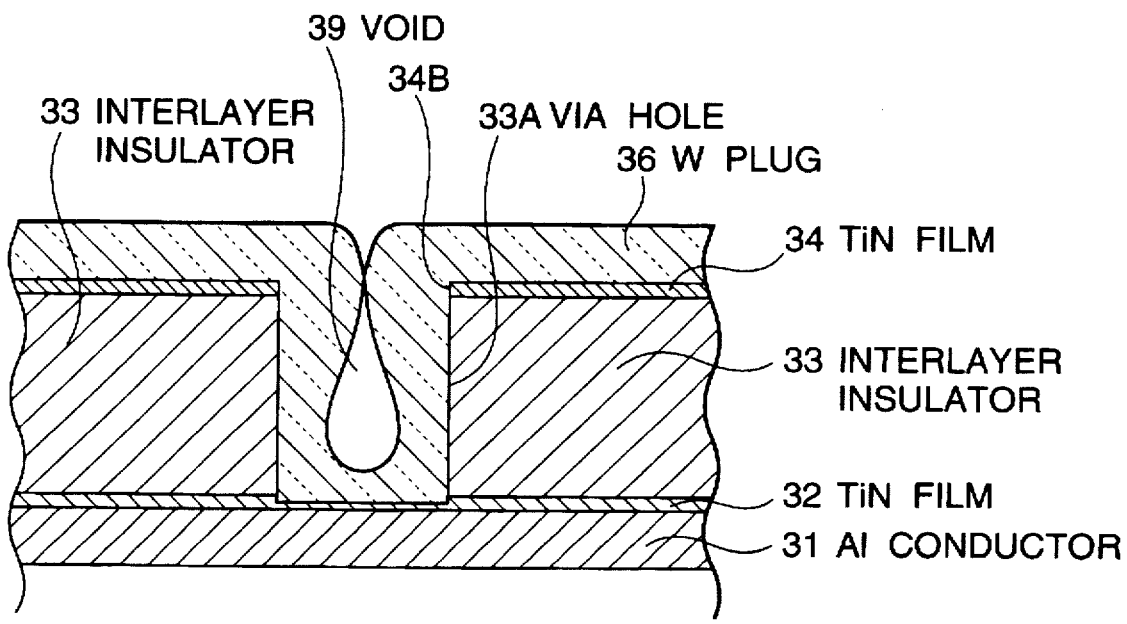
FIG. 2 is a diagrammatic sectional view illustrating a modified conventional blanket WCVC process.

As mentioned above, FIGS. 3A to 3D illustrate a first embodiment of the process in accordance with the present invention, and FIGS. 4A to 4C illustrate a second embodiment of the process in accordance with the present invention.

The process in accordance with the present invention shown in FIGS. 3A to 3D and FIGS. 4A to 4C includes an adhesion layer forming step, a photoresist film forming step, a mask forming step, an adhesion layer shaping step, a hole forming step and a tungsten depositing step, for the purpose of forming a W (tungsten) plug interconnecting two levels of wiring regions separated from each other by an interlayer insulator film.

In the adhesion layer forming step, an adhesion layer 14 or 24 is deposited on an interlayer insulator layer 13 or 23.

In the photoresist film forming step, a photoresist layer 15 or 25 are formed on the adhesion layer 14 or 24.

In the mask forming step, an opening 15A or 25A is formed in the photoresist layer 15 or 25. Thus, a mask for forming a hole in the interlayer insulator layer 13 or 23 or formed of the photoresist layer 15 or 25 having the opening 15A or 25A formed therein.

In the adhesion layer shaping step, the adhesion layer 14 or 24 is selectively removed and shaped so as to form an opening corresponding to the opening formed in the photoresist layer and to further remove, from around an edge of the opening formed in the photoresist layer (namely, an edge of an opening of a possible hole formed in the interlayer insulator layer), the adhesion layer which would otherwise become a growth core when tungsten is grown in the possible hole.

In the hole forming step, a hole 13A or 23A is formed to pass through the interlayer insulator film 13 or 23 by using the photoresist film 15 or 25 as a mask.

In the tungsten depositing step, a W layer 16 or 26 is deposited in the hole 13A or 23A formed in the interlayer insulator film 13 or 23, for the purpose of forming a W plug.

More specifically, in the adhesion layer shaping step, the adhesion layer 14 or 24 is selectively removed and shaped by using the photoresist film 15 or 25 as a mask. Particularly, the selective removal of the adhesion layer 14 or 24 is carried out by an isotropic etching using, as a mask, the photoresist layer 15 or 25 having the opening 15A or 25A formed therein, so that the opening 14A or 24A formed in the adhesion layer 14 or 24 is retracted outwardly from the edge of the opening 15A or 25A formed in the photoresist layer 15 or 25.

In the tungsten depositing step, the tungsten layer 16 or 26 is directly deposited into the hole 13A or 23A of the interlayer insulator film 13 or 23. Alternatively, before the tungsten layer 16 or 26 is deposited into the hole 13A or 23A or the interlayer insulator film 13 or 23, a second adhesion layer (Ti film 27, second TiN film 28) is formed on a side wall and a bottom of the hole 13A or 23A of the interlayer insulator film 13 or 23, and thereafter, the tungsten layer 16 or 26 or deposited into the hole of the interlayer insulator film.

The adhesion layer 14 or 24 is formed of for example a titanium nitride film.

Next, the first embodiment of the process in accordance with the present invention for forming a via-hole filling W plug, will be described in detail with reference to FIGS. 3A to 3D.

Figure 3A:
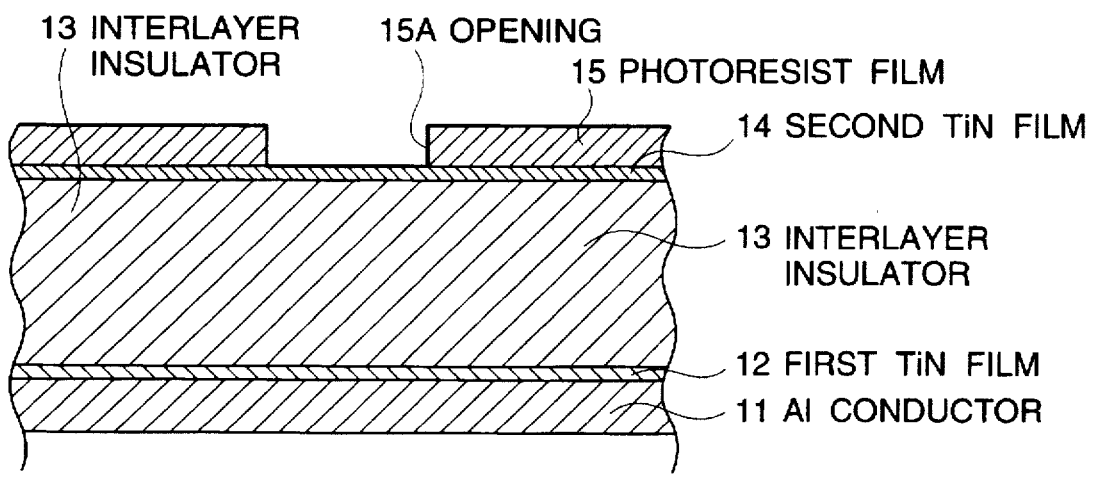
FIGS. 3A to 3D are diagrammatic sectional views illustrating a first embodiment of the process in accordance with the present invention for forming a via-hole filling W plug.

As shown in FIG. 3A, on a lower level wiring Al conductor 11, a first adhesion TiN Layer 12 of for example 500 Å thickness is formed, and an interlayer insulator film 13 is also formed on the first adhesion TiN layer 12.

Thereafter, a second adhesion TiN layer 14 of for example 500 Å thickness is formed on the interlayer insulator film 13 by a sputtering (adhesion layer forming step).

On the second TiN film 14, a photoresist film 15 is deposited (photoresist film forming step), and a conventional photolithography is carried out to form an opening 15A in the photoresist film 15 so that a mask for forming a hole in the interlayer insulator film 13 is formed as shown in FIG. 3A (mask forming step).

Figure 3B:
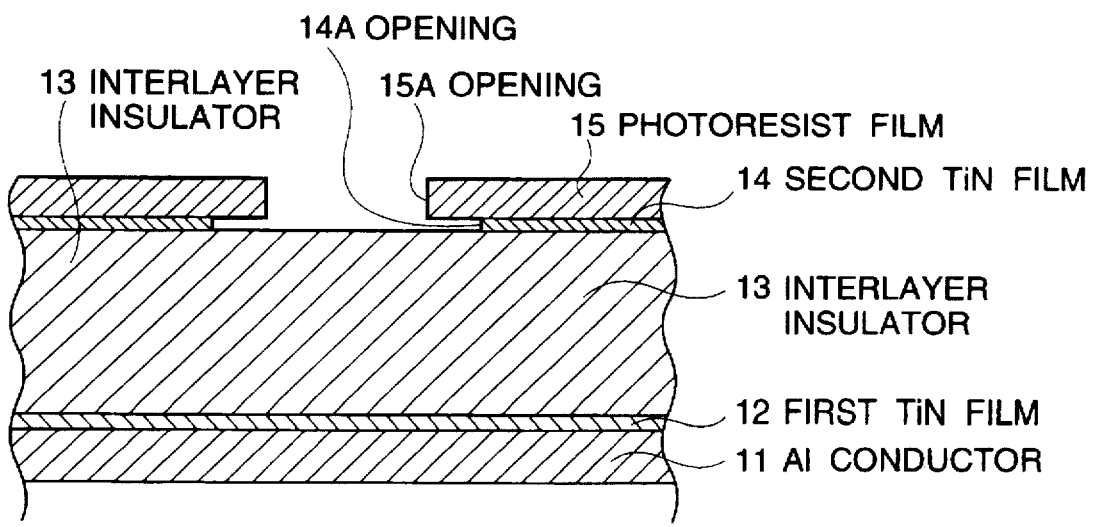

Then, as shown in FIG. 3B, an isotropic etching is performed to selectively remove the second TiN film 14 so as to form an opening 14A having a radius larger than that of the opening 15A in the photoresist film 15 by about 500 Å (adhesion layer shaping step). This removes the TiN layer 14 which would otherwise become a W growth core in the tungsten depositing step where tungsten is grown in a hole formed through the interlayer insulator layer. For example, the isotropic etching for selectively removing the TiN film 14 is carried out by using a chlorine gas.

Figure 3C:
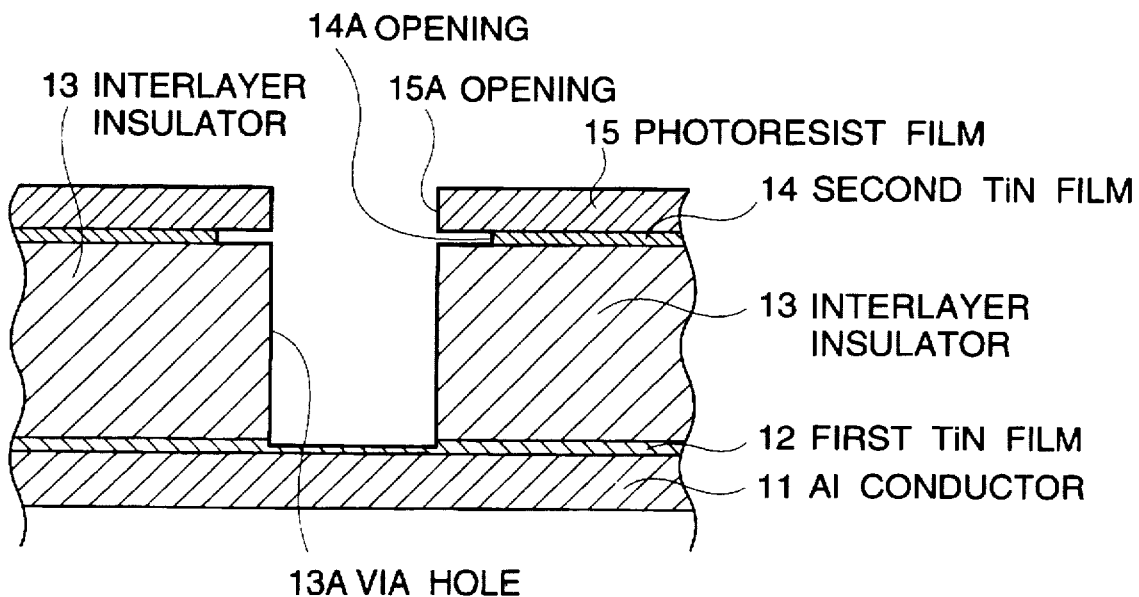

Succeedingly, as shown in FIG. 3C, by using the photoresist film 15 as a mask, the interlayer insulator layer 13 is selectively removed by an anisotropic etching such as a reactive ion etching, until the first TiN film 12 on the lower level wiring conductor 11 is exposed. Thus, a via-hole 13A is formed through the interlayer insulator layer 13 (hole forming step). In this process, for example, CHF3 is used as an etching gas. A diameter of the via-hole 13A thus formed is substantially the same as that of the opening 15A of the photoresist film 15.

After the via-hole 13A is formed, the photoresist film 15 is removed. Thereafter, a blanket WCVD is carried out to cause a W layer 16 to be grown in the via-hole 13A and is periphery (tungsten depositing step).

On the first TiN film 12 on the lower level wiring conductor 11 and the second TiN film 14 on the interlayer insulator film 13, the TiN films becomes a W growth core, and therefore, the growth speed of the W layer 16 is higher than that of a side wall of the via-hole. In addition, in the first embodiment, since an edge of the opening 14A of the second TiN film 14 is retracted outwardly from the edge of the opening of the via-hole 13A by 500 Å, the TiN film 14, which becomes a W growth core, does not exist around the opening of the via-hole 13A. Accordingly, the growth of the W film 16 is suppressed around the opening of the via-hole 13A, so that the W layer 16 is grown from the bottom of the via-hole 13A toward the whole of the via hole 13A. In other words, there is no possibility that because of a quick growth of the W layer 16 around the opening of the via-hole 13A, the opening of the via-hole 13A is closed at an early stage before the whole of the via-hole is completely filled with the W layer 16. Therefore, no void occurs in the W layer 16 grown in the via-hole 13A.

Figure 3D:
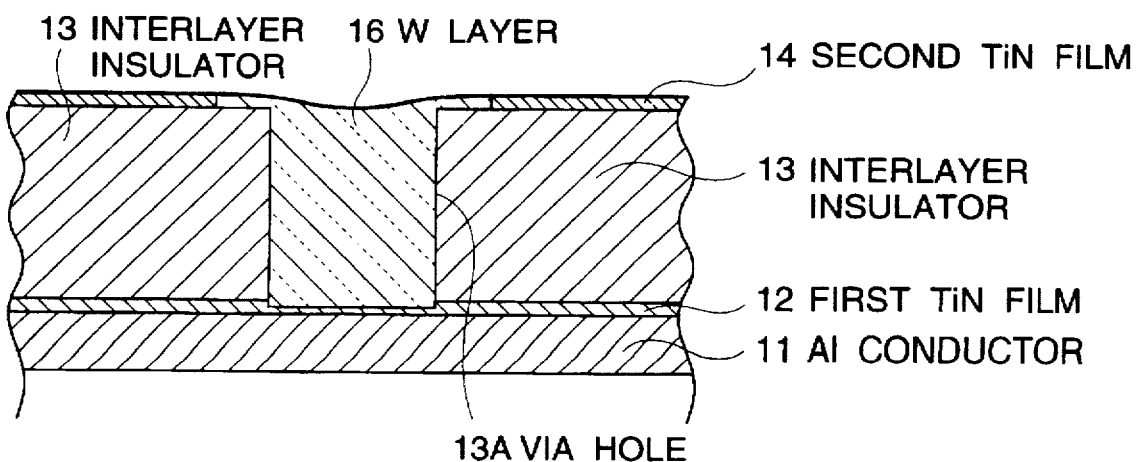

After the W layer is grown, as shown in FIG. 3D, the W layer is etched back until the TiN film 14 is exposed, so that the W layer 16 remains only in the via-hole 13A and on the surface of the interlayer insulator film 13 continuing to the exposed TiN film 14. This remaining W layer 16 forms a W plug.

Since no void exists in the W plug, reliability is elevated. If a void exists in the W plug, disconnection often occurs, because the wiring conductor falls into the void, or because an upper portion of the W plug bursts and disappears due to expansion of gas remaining in the void. This first embodiment can eliminate the disconnections attributable to these causes.

Incidentally, in the above mentioned process, the TiN layer 12 functions not only as the adhesion layer, but also as a barrier metal for preventing reaction between the lower level wiring Al conductor 11 and the W layer 16.

Next, the second embodiment of the process in accordance with the present invention for forming a contact hole filling W plug interconnecting a diffused region and a wiring conductor, will be described in detail with reference to FIGS. 4A to 4C.

As shown in FIG. 4A, an interlayer insulator film 23 is formed on a silicon substrate 21 having a diffused region 21A formed in a principal surface thereof. A first adhesion TiN film 24 of about 500 Å thickness is formed on the interlayer insulator film 23 by sputtering (adhesion layer forming step).

Then, a photoresist film 25 is formed on the first TiN film 24 (photoresist film forming step), and conventional photolithography is carried out to form an opening 25A in the photoresist film 25 so that a mask for forming a hole in the interlayer insulator film 23 is formed as shown in FIG. 4A (mask forming step).

Furthermore, an isotropic etching is performed by using the photoresist film 25 as a mask, to selectively remove the first TiN film 24 so as to form an opening 24A having a radius larger than that of the opening 25A in the photoresist film 25 by about 500 Å. This removes the TiN layer 24 which would otherwise become a W growth core in the tungsten depositing step where tungsten is grown in a hole form through the interlayer insulator layer (adhesion layer shaping step). For example, the isotropic etching for selectively removing the TiN film 24 is carried out by a plasma etching using a chlorine gas.

Succeedingly, by also using the photoresist film 25 as the mask, the interlayer insulator layer 23 is removed by an anisotropic etching such as a reactive ion etching, until the diffused region 21A on the substrate 21 is exposed. Thus, a contact hole 23A is formed through the interlayer insulator layer 23 (hole forming step). A diameter of the contact hole 23A thus formed is substantially the same as that of the opening 25A of the photoresist film 25.

In this second embodiment, an adhesion layer is provided on a side wall and a bottom of the contact hole 23A of the interlayer insulator film 23, differently from the first embodiment. For this purpose, as shown in FIG. 4B, in a condition in which the photoresist film 25 still remains, a Ti (titanium) film 27 is formed by sputtering as a contact metal with the silicon substrate 21 in the diffusion region 21A, and a second TiN film 28 is formed by sputtering as a barrier metal for preventing reaction between the silicon substrate and the tungsten (W). In this process, the Ti film 27 and the TiN film 28 are formed on the photoresist film 25 and the side surface of the opening 25A. However, an area in which the Ti film 27 and the TiN film 28 are formed to overhang, is in the proximity of the opening 25A of the photoresist film 25. On the other hand, since the edge of the opening of the TiN film 24 is retracted outwardly in the proximity of the edge of the opening of the hole 23A of the interlayer insulator layer 23, the overhang of the TiN film which becomes a W growth core does not exist. For example, at the bottom of the contact hole 23A, the thickness of the Ti film 27 is on the order of 300 Å, and the thickness of TiN film 28 is on the order of 500 Å. Thereafter, the photoresist film 25 and the Ti film 27 and the TiN film 28 on the photoresist 25 are simultaneously removed.

Thereafter, similarly to the first embodiment, a blanket WCVD is carried out to cause a W layer 26 to be grown in the contact hole 23A and its periphery (tungsten depositing step). Here, on the second TiN film 28 in the inside of the contact hole 23A and on the first TiN film 24 on the interlayer insulator film 23, the growth of the W layer is faster than the other portion. In this second embodiment, since an edge of the opening 24A of the first TiN film 24 is retracted outwardly from the edge of the opening of the contact hole 23A by 500 Å, no void occurs in the W layer 26 deposited in the contact hole 23A, similarly to the first embodiment.

After the W layer is grown, as shown in FIG. 4C, the W layer is etched back until the TiN film 24 is exposed, so that the W layer 26 remains only in the contact hole 23A and on the surface of the interlayer insulator film 23 continuing to the exposed TiN film 24. This remaining W layer 26 forms a W plug. Since no void exists in the W plug, reliability is elevated. This second embodiment can eliminate disconnections attributable to the void, similarly to the first embodiment.

In this second embodiment, if an adhesion and barrier layer is formed on the side wall and the bottom of the hole formed in the interlayer insulator film, it is possible to freely select the method for depositing the W layer and also to freely select an object to be connected by an W plug.

Figure 5A:
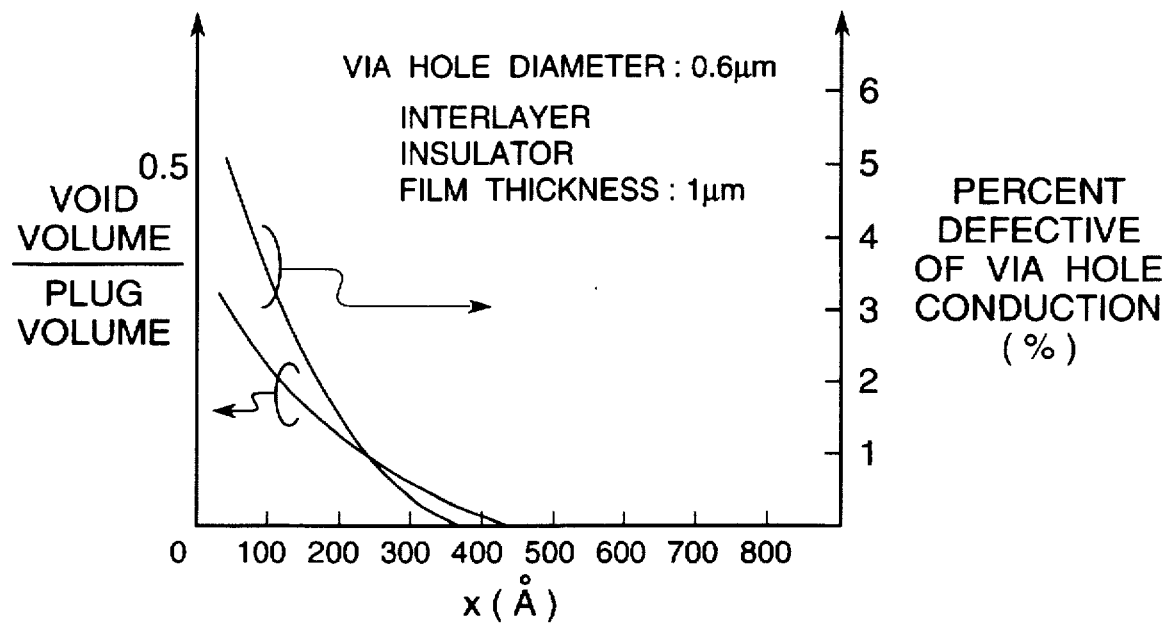
FIGS. 5A and 5B illustrate an advantage of the process in accordance with the present invention.
Figure 5B:
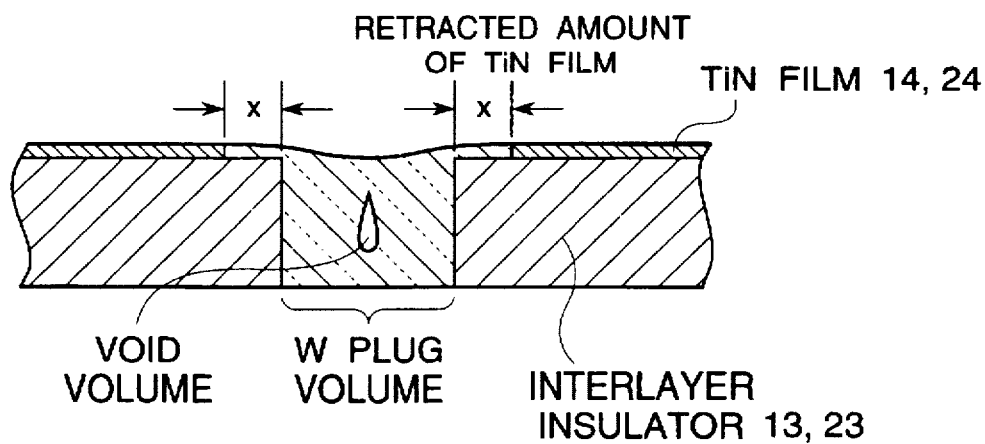

Referring to FIGS. 5A and 5B, there is illustrated a relation between the retracted amount of the TiN film from the opening edge of the holes 13A and 23A in the interlayer insulator films 13 and 23 in the first and second embodiments, the void volume and the percent defective of the via-hole conduction. As seen from FIG. 5, if no void occurs in the plug, the reliability of the wiring is greatly improved. For example, in the case that the via-hole diameter is 0.6 μm, the edge of the opening of the TiN film formed on the interlayer insulator film is preferably retracted outwardly from the edge of the opening of the hole formed in the interlayer insulator film, by not less than about 400 Å.

In the above mentioned embodiments, the W plugs have been formed. However, the conception of the present invention makes it possible to form a plug which formed of a metal other than W, or a compound of a metal selected from the group including W and other metals.

The invention has thus been shown and described with reference to the specific embodiments. However, it should be noted that the present invention is in no way limited to the details of the illustrated structures but changes and modifications may be made within the scope of the appended claims.

I claim:

1. A method for forming a tungsten plug interconnecting an upper level conductor and a diffused region in a substrate, insulated from each other by an interlayer insulator film, comprising the steps of:

forming said interlayer insulator film on said diffused region;

forming an adhesion layer on said interlayer insulator film;

forming a photoresist layer on said adhesion layer;

forming an opening in said photoresist layer so as to prepare a mask layer of said photoresist layer having said opening for a hole to be formed in said interlayer insulator film;

etching using, as a mask, said photoresist layer having said opening formed therein, to selectively remove said adhesion layer to form an opening corresponding to said opening formed in said photoresist layer and to further remove, from around an edge of said opening formed in said photoresist layer, said adhesion layer which would otherwise become a growth core when a tungsten is grown, so that a radially outermost edge of said opening formed in said adhesion layer is retracted outwardly from said edge of said opening formed in said photoresist layer by not less than about 400 Å and not more than about 500 Å;

forming a hole through said interlayer insulator film so that said diffused region is exposed at a bottom of said hole;

forming an adhesion and barrier layer on a side wall and a bottom of said hole of said interlayer insulator film, in contact with said diffused region; and depositing a tungsten layer in said hole of said interlayer insulator film so as to form a tungsten filling for said hole of said interlayer insulator film in contact with said adhesion and barrier layer.

2. The method claimed in claim 1, wherein said diffused region is in a silicon substrate and wherein said adhesion layer is a titanium nitride film, and said adhesion and barrier layer is a titanium film formed on said diffusion region as a contact metal with said diffusion region, and further comprising the step of forming a titanium nitride film on said titanium film as a barrier metal for preventing reaction between said silicon substrate and said tungsten layer.

3. The method claimed in claim 2, wherein said adhesion layer formed of the titanium nitride film has a thickness of at least 500 Å.

4. The method of claim 1, wherein the adhesion and barrier layer is formed on the side wall and bottom of the hole and on the photoresist layer but not on the radially outermost edge of the opening in the adhesion layer, and further comprising the step of removing the photoresist layer and the adhesion and barrier layer formed thereon before depositing the tungsten layer, so that the adhesion layer is exposed and so that the interlayer insulator film is exposed between the radially outermost edge of the opening in the adhesion layer and an upper edge of the hole in the interlayer insulator film.

5. The method of claim 1, wherein said adhesion and barrier layer directly contacts said diffused region.

* * * * *